(12) United States Patent
Liu et al.

(10) Patent No.: US 10,306,767 B2
(45) Date of Patent: May 28, 2019

(54) MANUFACTURING METHOD FOR FORMING SUBSTRATE STRUCTURE COMPRISING VIAS

(71) Applicant: UNIFLEX Technology Inc., Taichung (TW)

(72) Inventors: Yi-Chun Liu, New Taipei (TW); Yuan-Chih Lee, Taoyuan (TW); Hung-Tai Ting, Taoyuan (TW)

(73) Assignee: UNIFLEX Technology Inc., Taichung (TW)

( * ) Notice: Subject to any disclaimer, the term of this patent is extended or adjusted under 35 U.S.C. 154(b) by 0 days.

(21) Appl. No.: 15/834,066

(22) Filed: Dec. 7, 2017

(65) Prior Publication Data

US 2019/0008049 A1  Jan. 3, 2019

(30) Foreign Application Priority Data

Jun. 30, 2017  (TW) .............................. 106121924 A

(51) Int. Cl.
*H05K 3/00* (2006.01)
*H01L 21/48* (2006.01)
(Continued)

(52) U.S. Cl.
CPC ............... *H05K 3/002* (2013.01); *C23F 1/00* (2013.01); *H01L 21/486* (2013.01); *H05K 3/42* (2013.01);
(Continued)

(58) Field of Classification Search
CPC .... H05K 1/0298; H05K 1/0346; H05K 1/115; H05K 3/002; H05K 2203/0776;
(Continued)

(56) References Cited

U.S. PATENT DOCUMENTS

| 4,426,253 A | 1/1984 | Kreuz et al. | |
| 6,039,889 A * | 3/2000 | Zhang | H05K 3/0038 216/13 |

(Continued)

FOREIGN PATENT DOCUMENTS

| CN | 103717014 | 4/2014 |
| CN | 104233302 | 12/2014 |
| CN | 205946362 | 2/2017 |

OTHER PUBLICATIONS

"Office Action of Taiwan Counterpart Application", dated Mar. 27, 2018, p. 1-p. 9.
(Continued)

*Primary Examiner* — Lan Vinh
(74) *Attorney, Agent, or Firm* — JCIPRNET

(57) ABSTRACT

A manufacturing method of a substrate structure including vias includes the following steps. A substrate is provided, wherein a material of the substrate includes polyimide. An etching stop layer is formed on the substrate, wherein the etching stop layer covers two opposite surfaces of the substrate. A patterned process is performed on the etching stop layer to form a plurality of openings exposing a part of the substrate. An etching process is performed on the substrate to remove the part of the substrate exposed by the openings and form a plurality of vias.

9 Claims, 5 Drawing Sheets

(51) Int. Cl.
*C23F 1/00* (2006.01)
*H05K 3/42* (2006.01)

(52) U.S. Cl.
CPC ..... *H05K 3/421* (2013.01); *H05K 2203/0776* (2013.01)

(58) Field of Classification Search
CPC ........ H05K 3/42; H05K 3/421; H01L 21/486; C23F 1/00
USPC ................. 216/13, 17, 18, 19, 20, 102, 103; 438/620, 622, 628
See application file for complete search history.

(56) References Cited

U.S. PATENT DOCUMENTS

| | | | |
|---|---|---|---|
| 2008/0053688 A1* | 3/2008 | Park ..................... | H05K 3/4602 174/258 |
| 2010/0159191 A1* | 6/2010 | Imai ..................... | H01L 21/6836 428/131 |
| 2013/0092422 A1* | 4/2013 | Wang .................... | H05K 3/244 174/257 |
| 2015/0021072 A1* | 1/2015 | Choi ..................... | H05K 3/244 174/257 |

OTHER PUBLICATIONS

"Office Action of Taiwan Counterpart Application", dated Aug. 11, 2017, p. 1-p. 8, in which the listed references were cited.

* cited by examiner

MANUFACTURING METHOD FOR FORMING SUBSTRATE STRUCTURE COMPRISING VIAS

CROSS-REFERENCE TO RELATED APPLICATION

This application claims the priority benefit of Taiwan application serial no. 106121924, filed on Jun. 30, 2017. The entirety of the above-mentioned patent application is hereby incorporated by reference herein and made a part of this specification.

BACKGROUND

Technical Field

The disclosure relates to a manufacturing method of a substrate structure, and in particular, a manufacturing method for forming a substrate structure including vias.

Description of Related Art

As the final step of manufacturing an integrated circuit product, packaging of the integrated circuit is intended to provide a chip with an electrical connection medium to a printed circuit board or other adequate devices and protect the chip. In a module of the integrated circuit, since a large number of wires are released from the chip, hundreds of connections are required to form a complete circuit. In conventional chip packaging, a lead frame is used to electrically connect the chip to packaged external wires. As the integrity of the integrated circuit increases, although the package size remains unchanged or is reduced, the required wires increase significantly. Therefore, the conventional lead frame is no longer sufficient for the purpose, and various packaging techniques have been developed to accommodate and connect more wires and complete more complex circuits.

In recent years, electronic products have developed to become lighter, thinner, shorter, and smaller than ever. In response to this trend, design and manufacturing of the wire layout on the circuit substrate also need to be improved. To increase the layout density of the circuit, in addition to narrowing the linewidth, a diameter of through holes of the circuit substrate may also be reduced to make the operation of the circuit faster and more efficient.

Conventionally, through holes are formed on the circuit substrate by mechanical drilling. However, due to the precision of mechanical processing, the diameter of the through holes cannot be further reduced, and the purpose of linewidth narrowing cannot be achieved. If a high-power laser is adopted instead to drill holes on the circuit substrate, the diameter of the formed through holes can be further reduced. However, laser processing incurs higher costs, and the vias formed by laser exhibit a high aspect ratio and thus are not suitable for many applications. Moreover, it is relatively difficult to control the depth of the vias, causing the vias to be overly shallow or overly deep.

SUMMARY

The embodiments of the disclosure provide a manufacturing method for forming a substrate structure including vias that incurs lower manufacturing costs and meets the requirement for a fine pitch.

A manufacturing method for forming a substrate structure including vias of the embodiments of the disclosure includes the following steps: providing a substrate, wherein a material of the substrate includes polyimide; forming an etching stop layer on the substrate, wherein the etching stop layer covers two opposite surfaces of the substrate; performing a patterned process on the etching stop layer to form a plurality of openings exposing a part of the substrate; and performing an etching process on the substrate to remove the part of the substrate exposed by the openings and form a plurality of vias.

In an embodiment of the disclosure, the etching process includes etching the substrate by using an alkaline etching liquid.

In an embodiment of the disclosure, the etching stop layer includes a photoresist layer, and the patterned process includes an exposure developing process.

In an embodiment of the disclosure, the manufacturing method of a substrate structure further includes removing the patterned photoresist layer after the vias are formed.

In an embodiment of the disclosure, the etching stop layer includes a metal layer, and the patterned process includes a metal etching process.

In an embodiment of the disclosure, the metal etching process includes etching the metal layer by using an acid etching liquid.

In an embodiment of the disclosure, the manufacturing method of a substrate structure further includes performing a chemical plating process on the substrate to form a seed layer, wherein the seed layer covers the two opposite surfaces of the substrate and an inner wall of each of the vias.

In an embodiment of the disclosure, the manufacturing method of a substrate structure further includes: forming a conductive layer on the seed layer by using the seed layer as a conductive path; forming a photoresist layer on the seed layer, the photoresist layer covering the vias and a part of the seed layer; and performing a patterned process on the conductive layer and the seed layer to remove the part of the conductive layer and the seed layer exposed by the photoresist layer.

In an embodiment of the disclosure, the manufacturing method of a substrate structure further includes: forming a photoresist layer on the seed layer, the photoresist layer exposing the vias and a part of the seed layer; forming a patterned conductive layer on the exposed part of the seed layer by using the exposed part of the seed layer as a conductive path; removing the photoresist layer; and patterning the seed layer to remove the part of the seed layer exposed by the photoresist layer.

In an embodiment of the disclosure, a diameter of each of the vias is substantially 20 μm to 150 μm.

In light of the above, in the manufacturing method of the substrate structure of the embodiments of the disclosure, since the vias are formed by performing the etching process on the substrate, the plurality of vias may be formed in mass production on the substrate by single etching process. Therefore, the manufacturing method of the substrate structure of the embodiments of the disclosure can effectively enhance a process efficiency and can further omit the expensive laser process and save manufacturing costs. Moreover, the vias formed by the etching process also meet the requirement for a fine pitch of the substrate structure.

To provide a further understanding of the aforementioned and other features and advantages of the disclosure, exemplary embodiments, together with the reference drawings, are described in detail below.

DESCRIPTION OF THE EMBODIMENTS

Figure 1:
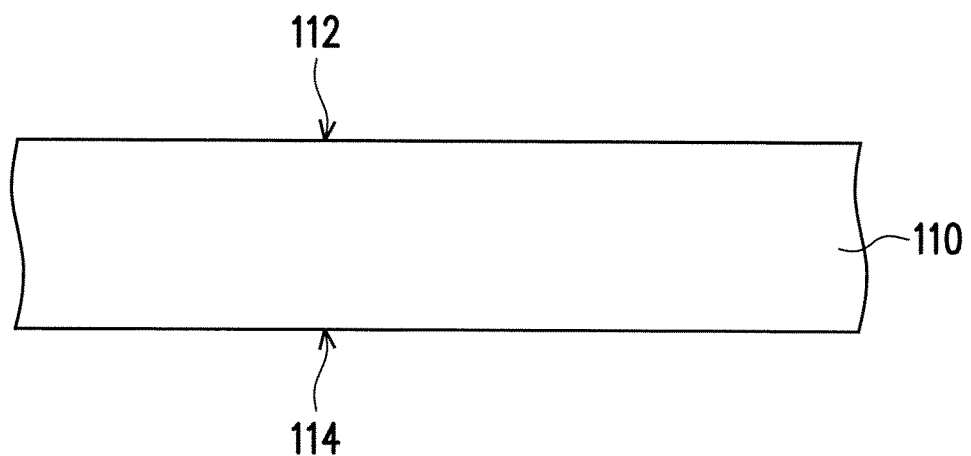
FIG. 1 to FIG. 4 are cross-sectional schematic diagrams illustrating a partial process of a manufacturing method of a substrate structure according to an embodiment of the disclosure.
Figure 2:
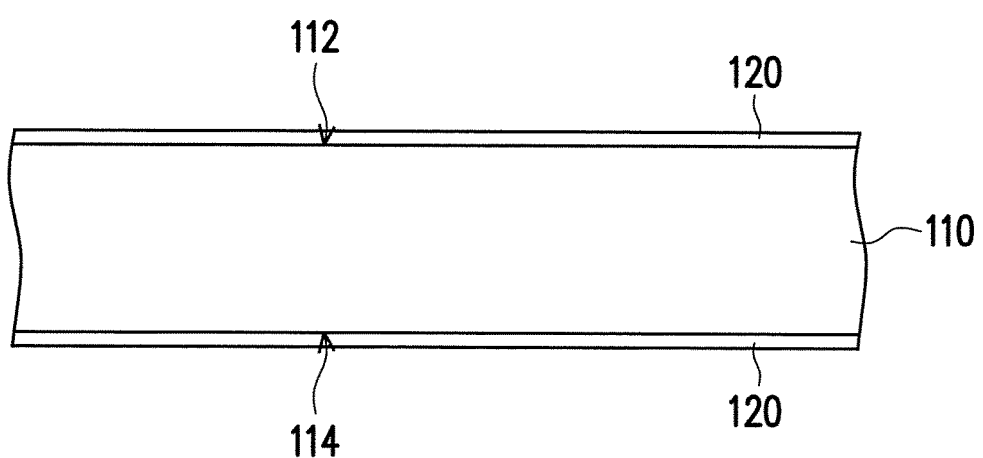

The foregoing and other technical content, features, and effects of the disclosure will be clearly presented in the following detailed description of the embodiments with reference to the reference drawings. Directional terminology, such as "upper", "lower", "front", "back", "left", "right", etc., mentioned in the embodiments below is used with reference to the orientation of the drawings attached. Accordingly, the directional terminology used will be regarded as illustrating rather than limiting the disclosure. Moreover, in the embodiments below, the same or similar components will be labeled with the same or similar reference numerals.

FIG. 1 to FIG. 4 are cross-sectional schematic diagrams illustrating a partial process of a manufacturing method of a substrate structure according to an embodiment of the disclosure. The manufacturing method of a substrate structure for forming a substrate structure 100 including vias of the present embodiment includes the following steps. First, a substrate 110 as shown in FIG. 1 is provided, wherein the substrate 110 includes two opposite surfaces 112, 114 and a material of the substrate 110 includes polyimide (PI). Then, referring to FIG. 2, an etching stop layer 120 is formed on the substrate 110, and the etching stop layer 120 covers the two opposite surfaces 112, 114 of the substrate 110.

Figure 3:
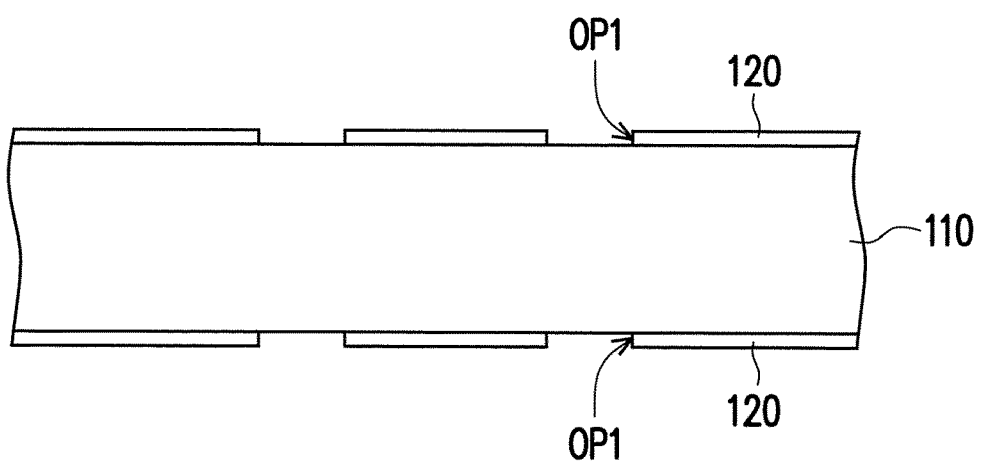

Next, referring to FIG. 3, a patterned process is performed on the etching stop layer 120 to form a plurality of openings $OP_1$, wherein the openings $OP_1$ expose a part of the surfaces 112, 114 of the substrate 110. In the present embodiment, the etching stop layer 120 is a photoresist layer which has photosensitivity and is adapted to be patterned through a photolithography process. Accordingly, the foregoing patterned process may be a photolithography process so as to form a plurality of openings $OP_1$ on the photoresist layer.

Figure 4:
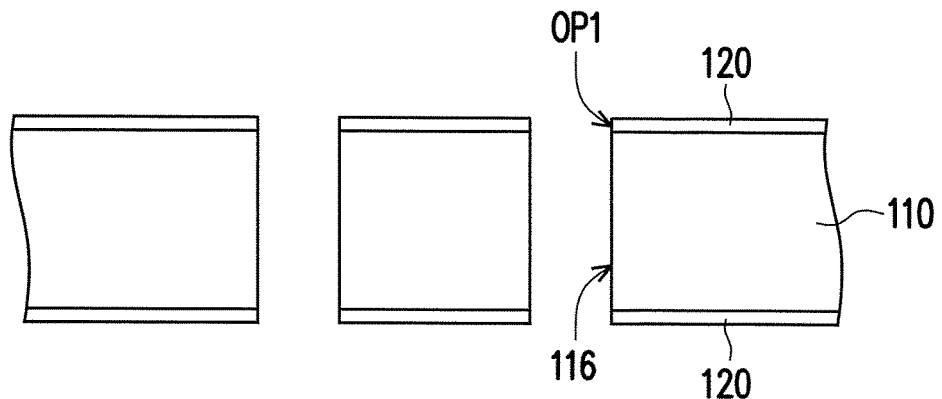

Next, referring to FIG. 4, the etching stop layer 120 including the openings OP 1 is used as a mask for performing an etching process on the substrate 110 to remove the part of the substrate 110 exposed by the openings $OP_1$ and form a plurality of vias 116 as shown in FIG. 4. In the present embodiment, the foregoing etching process includes, for example, etching the substrate 110 including polyimide by using an alkaline etching liquid. Moreover, after the vias 116 are formed, the etching stop layer 120 being patterned is removed.

In the present embodiment, since the vias 116 of the substrate structure are formed by performing the etching process on the substrate 110, the plurality of vias (the vias are, for example, arranged in an array) are formed in mass production on the substrate 110 by performing the etching process once. Therefore, the manufacturing method of the substrate structure of the present embodiment can effectively enhance a process efficiency and can further omit an expensive laser process and save manufacturing costs. Moreover, a diameter of the vias 116 formed by the etching process is from about 20 μm to about 150 μm, which meets the requirement for a fine pitch of the substrate structure 100.

Figure 5:
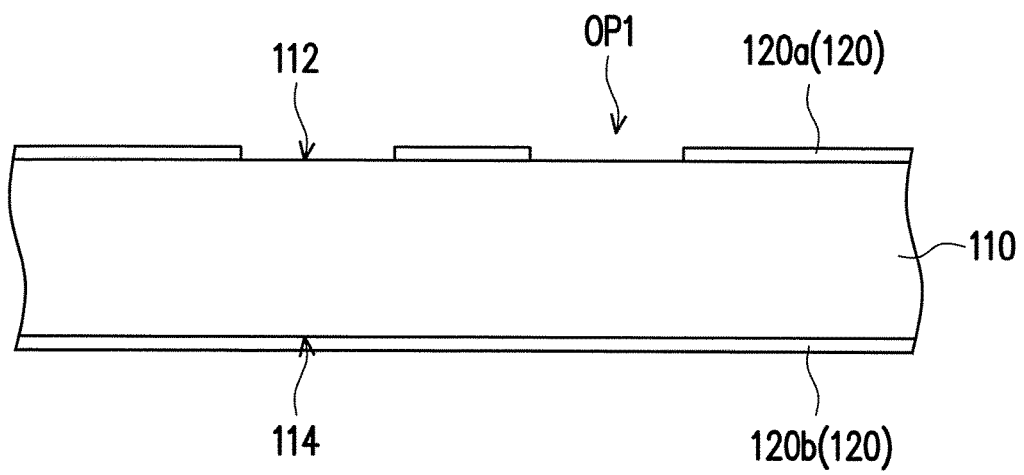
FIG. 5 to FIG. 6 are cross-sectional schematic diagrams illustrating a partial process of a manufacturing method of a substrate structure according to another embodiment of the disclosure.
Figure 6:
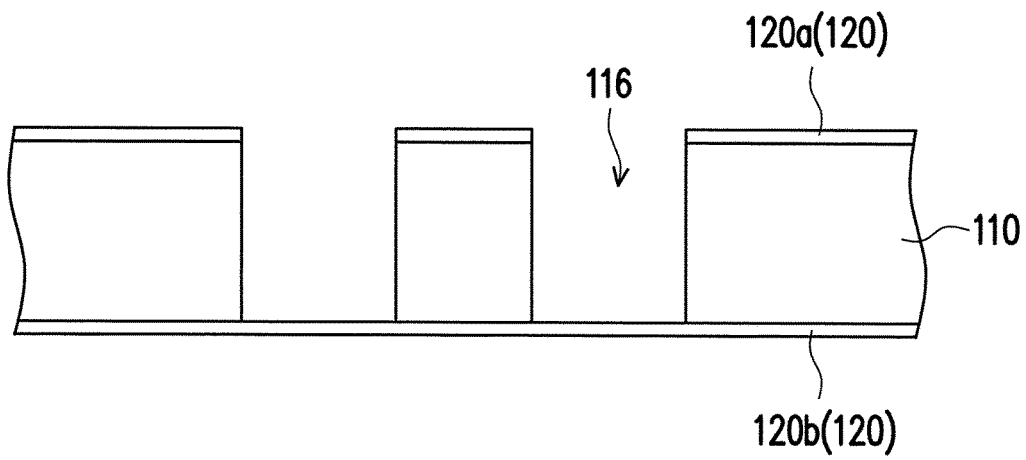

FIG. 5 to FIG. 6 are cross-sectional schematic diagrams illustrating a partial process of a manufacturing method of a substrate structure according to another embodiment of the disclosure. It should be noted here that the partial manufacturing process of the substrate structure of the present embodiment is similar to the manufacturing method of the substrate structure of the previous embodiment. Therefore, the reference numerals and a part of the contents in the previous embodiment are used in the present embodiment, in which identical reference numerals indicate identical or similar components, and description of the same technical contents is omitted. Reference may be made to the previous embodiment for a description of the omitted parts, which shall not be repeated in the present embodiment. Referring to FIG. 5 and FIG. 6, differences between the manufacturing method of the substrate structure of the present embodiment and the manufacturing method of the substrate structure of the previous embodiment will be described below.

In the present embodiment, the etching stop layer 120 is a metal layer. For example, the etching stop layer 120 is a copper layer. Accordingly, the foregoing patterned process is a metal etching process. In one embodiment, the metal etching process includes, for example, etching the metal layer 120 by using an acid etching liquid. In the present embodiment, the etching stop layer 120 includes a first metal layer 120a and a second metal layer 120b respectively covering the two opposite surfaces 112, 114 of the substrate 110. Then, a patterned process is performed on the first metal layer 120a covering the surface 112, for example, to form a plurality of openings $OP_1$. In other words, in the present embodiment, patterning is performed merely on one side (i.e., on the first metal layer 120a) to form the plurality of openings $OP_1$. Next, the first metal layer 120a being patterned and the second metal layer 120b are used as masks for performing unidirectional etching on the substrate 110 to form a plurality of vias 116. Of course, the disclosure is not limited hereto. In other embodiments, the patterned process may also be performed on both the first metal layer 120a and the second metal layer 120b to foil ii a plurality of corresponding openings $OP_1$ on the first metal layer 120a and the second metal layer 120b, and then bidirectional etching is performed on the substrate 110 by using the first metal layer 120a and the second metal layer 120b including the corresponding openings OP' as masks to form a plurality of vias 116. After the vias 116 are formed, the etching stop layer 120 is selectively removed.

Afterwards, a patterned conductive layer 140 is formed on the substrate 110. For example, a method of forming the patterned conductive layer 140 includes the following steps. First, referring to FIG. 7, a chemical plating process is performed on the substrate 110 to metalize the surface of the substrate 110 and form a seed layer 130. In the present embodiment, the seed layer 130 at least covers the two opposite surfaces 112, 114 of the substrate 110 and an inner wall of each of the vias 116. The chemical plating process is an autocatalytic oxidation-reduction reaction, wherein a chemical copper plating solution is used, for example, and copper ions gain electrons and are reduced to metal copper during the chemical plating process.

Figure 8:
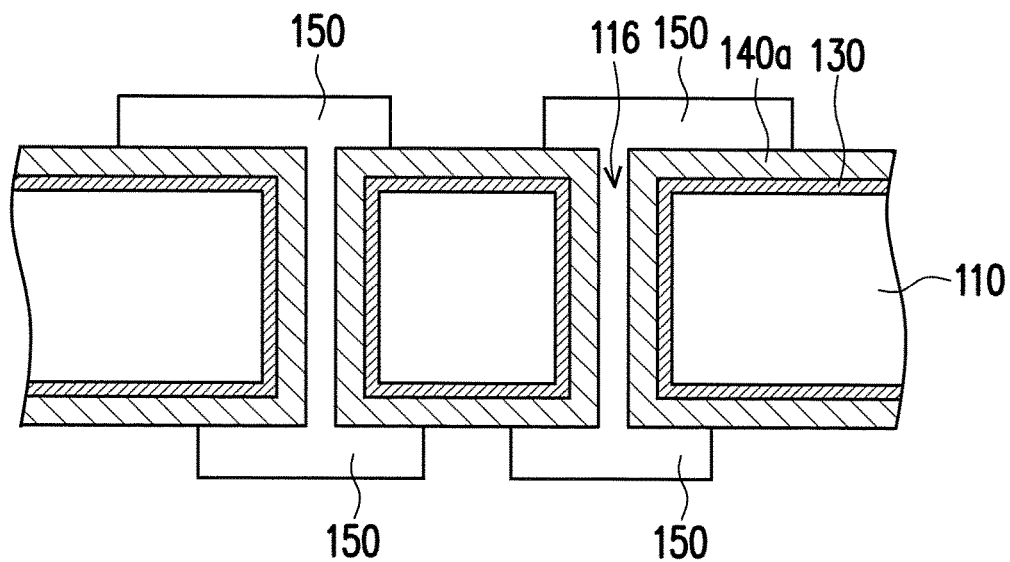
Figure 9:
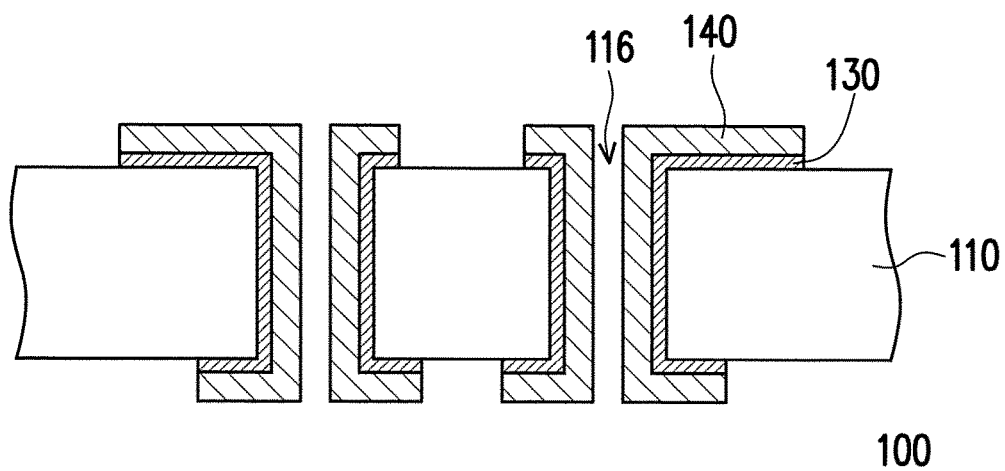

Then, the seed layer 130 is used as a conductive path to form a conductive layer 140a as shown in FIG. 8 on the seed layer 130 through an electroplating process. Next, a photoresist layer 150 as shown in FIG. 8 is formed on the conductive layer 140a. The photoresist layer 150 covers the vias 116 and exposes a part of the conductive layer 140a. Afterwards, a patterned process is performed on the conductive layer 140a and the seed layer 130 to remove the part of the conductive layer 140a and the seed layer 130 exposed by the photoresist layer 150 and thereby form the patterned conductive layer 140 as shown in FIG. 9. At the time, the manufacturing method of the substrate structure 100 is substantially completed.

Figure 10:
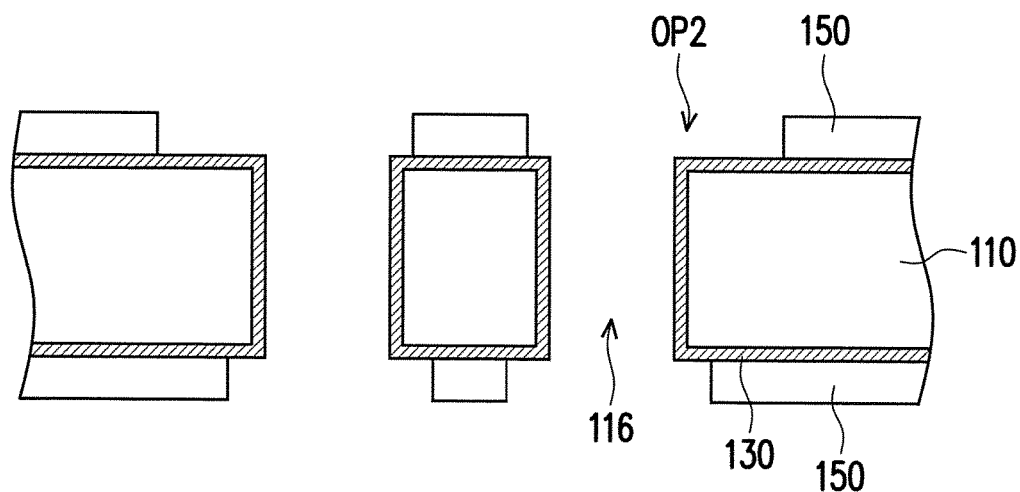
FIG. 10 to FIG. 11 are cross-sectional schematic diagrams illustrating a partial process of a manufacturing method of a substrate structure according to another embodiment of the disclosure.
Figure 11:
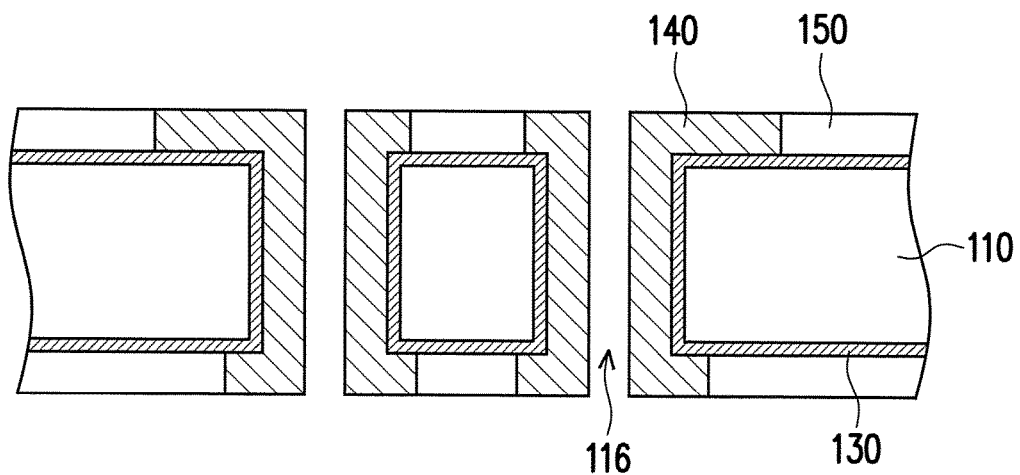

FIG. 10 to FIG. 11 are cross-sectional schematic diagrams illustrating a partial process of a manufacturing method of a substrate structure according to another embodiment of the disclosure. It should be noted here that the partial manufacturing process of the substrate structure of the present embodiment is similar to the partial manufacturing process of the substrate structure of FIG. 7 to FIG. 9. Therefore, the reference numerals and a part of the contents in the previous embodiment are used in the present embodiment, in which identical reference numerals indicate identical or similar components, and description of the same technical contents is omitted. Reference may be made to the previous embodiment for a description of the omitted parts, which shall not be repeated in the present embodiment. Referring to FIG. 10 to FIG. 11, differences between the partial manufacturing process of the substrate structure of the present embodiment and the partial manufacturing process of the substrate structure of FIG. 7 to FIG. 9 will be described below.

Figure 7:
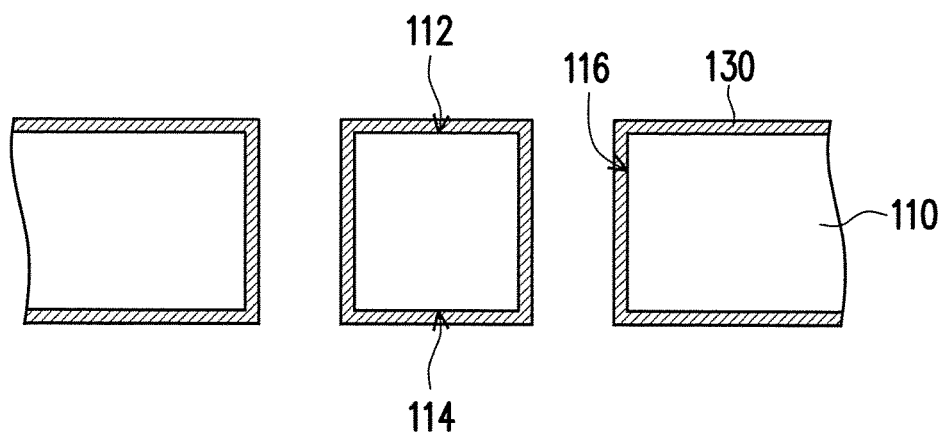
FIG. 7 to FIG. 9 are cross-sectional schematic diagrams illustrating a partial process of a manufacturing method of a substrate structure according to an embodiment of the disclosure.

In the present embodiment, after the seed layer 130 is formed (i.e., after the step of the process as shown in FIG. 7), a photoresist layer 150 as shown in FIG. 10 is formed on the seed layer 130. The photoresist layer 150 includes a plurality of openings $OP_2$ exposing the vias 116 and a part of the seed layer 130. Then, the exposed part of the seed layer 130 is used as a conductive path to form a patterned conductive layer 140 as shown in FIG. 11 on the exposed part of the seed layer 130. Afterwards, the photoresist layer 150 is removed and patterning is performed on the seed layer 130 to remove the part of the seed layer 130 exposed by the photoresist layer 150, and then the substrate structure 100 as shown in FIG. 9 is formed.

In summary of the above, in the manufacturing method of the substrate structure of the embodiments of the disclosure, since the etching process is performed on the substrate by using the alkaline etching liquid to form the vias, the plurality of vias are simultaneously formed in mass production on the substrate by performing the etching process once. Therefore, the manufacturing method of the substrate structure of the embodiments of the disclosure can effectively enhance a process efficiency and can further omit an expensive laser process and save manufacturing costs. Moreover, the vias formed through the etching process also meet the requirement for a fine pitch of the substrate structure. In addition, in the embodiments of the disclosure, the substrate is metalized through chemical plating to form the patterned conductive layer covering the inner wall of the vias.

Although the disclosure is disclosed as the embodiments above, the embodiments are not meant to limit the disclosure. Any person skilled in the art may make slight modifications and variations without departing from the spirit and scope of the disclosure. Therefore, the protection scope of the disclosure shall be defined by the claims attached below.

What is claimed is:

1. A manufacturing method for forming a substrate structure comprising vias, the manufacturing method comprising:
   providing a substrate, wherein a material of the substrate comprises polyimide;
   forming an etching stop layer on the substrate, wherein the etching stop layer covers two opposite surfaces of the substrate, and the etching stop layer comprises a metal layer;
   performing a patterned process on the etching stop layer to form a plurality of openings exposing a part of the substrate; and
   performing an etching process on the substrate by using the etching stop layer as a mask to remove the part of the substrate exposed by the openings and form the vias, wherein the etching process comprises etching the substrate by using an alkaline etching liquid.

2. The manufacturing method according to claim 1, wherein a diameter of each of the vias substantially ranges from 20 μm to 150 μm.

3. The manufacturing method according to claim 1, wherein the etching stop layer comprises a photoresist layer, and the patterned process comprises a photolithography process.

4. The manufacturing method according to claim 3, further comprising:
   after the vias are formed, removing the photoresist layer being patterned.

5. The manufacturing method according to claim 1, wherein the patterned process comprises a metal etching process.

6. The manufacturing method according to claim 5, wherein the metal etching process comprises etching the metal layer by using an acid etching liquid.

7. The manufacturing method according to claim 1, further comprising:
   performing a chemical plating process on the substrate to form a seed layer, wherein the seed layer covers the two opposite surfaces of the substrate and an inner wall of each of the vias.

8. The manufacturing method according to claim 7, further comprising:
   forming a conductive layer on the seed layer by using the seed layer as a conductive path;
   forming a photoresist layer on the conductive layer, the photoresist layer covering the vias and exposing a part of the conductive layer and the seed layer; and
   patterning the conductive layer and the seed layer to remove the part of the conductive layer and the seed layer exposed by the photoresist layer.

9. The manufacturing method according to claim 7, further comprising:
   forming a photoresist layer on the seed layer, the photoresist layer exposing the vias and a part of the seed layer;
   forming a patterned conductive layer on the exposed part of the seed layer by using the exposed part of the seed layer as a conductive path;
   removing the photoresist layer; and
   patterning the seed layer to remove the part of the seed layer exposed by the photoresist layer.

* * * * *